United States Patent [19]
Irie et al.

[11] Patent Number: 6,153,937
[45] Date of Patent: *Nov. 28, 2000

[54] SEMICONDUCTOR DEVICE AND METHOD OF THE SAME

[75] Inventors: Seishi Irie, Kanagawa-ken; Takahiro Sato, Oita-ken, both of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/893,261

[22] Filed: Jul. 15, 1997

[30] Foreign Application Priority Data

Jul. 16, 1996 [JP] Japan .................................. 8-185794

[51] Int. Cl.$^7$ .......................... H01L 23/48; H01L 23/52; H01L 29/40
[52] U.S. Cl. ......................... 257/775; 257/750; 257/758
[58] Field of Search .................................. 257/775, 750, 257/752, 758; 438/622–626

[56] References Cited

U.S. PATENT DOCUMENTS

| | | | |
|---|---|---|---|
| 4,997,790 | 3/1991 | Woo et al. ............... | 438/622 |
| 5,019,535 | 5/1991 | Wojnarowski et al. ........ | 257/750 |
| 5,293,503 | 3/1994 | Nishigoori et al. ......... | 257/586 |
| 5,405,807 | 4/1995 | Baker et al. ............... | 438/622 |
| 5,432,128 | 7/1995 | Tsu ....................... | 438/624 |
| 5,461,003 | 10/1995 | Havemann et al. .......... | 438/622 |
| 5,567,660 | 10/1996 | Chen et al. ............... | 438/622 |
| 5,567,661 | 10/1996 | Nishio et al. ............. | 438/622 |
| 5,627,403 | 5/1997 | Bacchetta et al. .......... | 257/639 |
| 5,665,643 | 9/1997 | Shin ....................... | 438/763 |
| 5,665,657 | 9/1997 | Lee ........................ | 438/624 |
| 5,716,872 | 2/1998 | Isobe ...................... | 438/622 |
| 5,798,298 | 8/1998 | Yang et al. ............... | 438/622 |
| 5,821,174 | 10/1998 | Hong et al. ............... | 438/788 |
| 5,872,052 | 2/1999 | Iyer ....................... | 438/622 |
| 5,872,401 | 2/1999 | Huff et al. ............... | 257/758 |

*Primary Examiner*—David Hardy
*Assistant Examiner*—Jhihan B Clark
*Attorney, Agent, or Firm*—Finnegan, Henderson, Farabow, Garrett & Dunner, L.L.P.

[57] ABSTRACT

An object of the present invention is to provide a semiconductor device where a metal wiring pattern is improved in order to prevent photoresist foaming from occurring without employing a special process, even if a protective layer void occur in a wire to wire space in the metal wire, and an arrangement method for a semiconductor device pattern. To achieve the above object, the present invention provides a semiconductor device comprising a first wiring layer and a second wiring layer arranged in a row on a semiconductor substrate, and a insulating layer on the first wiring layer and the second wiring layer so that a first portion of the insulating layer on the first wiring layer is prevented from touching a second portion of the insulating layer on the second wiring layer.

9 Claims, 4 Drawing Sheets

SEMICONDUCTOR DEVICE AND METHOD OF THE SAME

FIELD OF THE INVENTION

The present invention relates to a semiconductor device, particularly to a semiconductor device, which has improved metal wiring patterns, and a method for controlling the pattern arrangement for such a semiconductor device.

BACKGROUND OF THE INVENTION

In general, some semiconductor devices entail a wiring pattern where two or more metal wires are arranged side by side. Such a wiring pattern is used, for example, for a word line on a memory cell in a semiconductor device, such as a memory. Usually the metal wiring is designed so as to cover a specific width, so that all spaces between metal wires are widened to some extent.

FIG. 1 shows a sectional view of the wiring pattern on the conventional memory cell.

As shown in FIG. 1, the first passivation layer 2, i.e. a surface protective layer, is formed on a metal wire 1 in order to prevent deterioration due to humidity in the open air. For example, this first passivation layer 2 is formed in an about 0.4 $\mu$m thickness by PSG. Further, the second passivation layer 3 is formed on the first passivation layer 2 in an about 0.55 $\mu$m thickness by P (plasma)-SiN. Furthermore, an about 5 $\mu$m thick protective layer, such as of polyamide, is formed on the second passivation layer 3.

FIG. 1 shows a case where a metal wiring design rule allows the side to side configuration to spread. In this semiconductor device, the wiring pattern was not so much refined, because the wire to wire space was designed relatively wide. If this case was compared to the passivation layer thickness, the wiring space to the adjacent metal wire 1 is so wide that the passivation layers on the metal wire 1 could not touch each other.

However, in recent years when semiconductor devices have been increasingly refined and micro-miniaturized, the stricter design rule must be established. In other words, sometimes passivation layers on adjacent metal wires can touch each other, because the design tends toward a narrower wire to wire space width.

It is considered that such passivation layers touching causes void portions to occur at the touching points.

FIG. 2 shows a pattern for the conventional metal wiring layer in a semiconductor substrate. As illustrated in FIG. 2, the wire to wire spacing on the metal wire 1 includes wider and narrower portions due to contacts, and a 0.9±0.1 $\mu$m width. The metal wire 1 itself is also about 0.9±0.1 $\mu$m wide. As shown in FIG. 2, numeric values are examples of metal wire width and wire to wire spacing ($\mu$m in unit).

FIG. 3 shows a sectional view of the semiconductor device at a wiring pattern A–A' shown in FIG. 2. This semiconductor device has a structure closely similar to the structure shown in FIG. 1. However, the semiconductor device design must be highly refined, due to the narrower wire to wire spacing between metal wires. Metal wire 1 is about 0.9±0.1 $\mu$m wide and 0.8 to 0.9 $\mu$m thick. The first passivation layer 2, a surface protective layer, is formed on metal wire 1 to about 0.3 to 0.4 $\mu$m thickness above the wire. Further, the second passivation layer 3 is formed on the first passivation layer 2 to about 0.55 $\mu$m thickness above the first layer. Furthermore, a protective layer of e.g. polyamide is formed on the second passivation layer 3 to about 5 $\mu$m thickness.

Accordingly, the passivation layer covering each metal wire is about 0.6 $\mu$m wide, while the wire to wire spacing to the adjacent metal wires is about 0.9±0.1 $\mu$m. As a result, the adjacent portions of the second passivation layer 3 will overlap each other. Furthermore, since the first and second passivation layers 2 and 3 are formed on the metal wire 1 in an overhanging state, void portion 4 is formed between metal wires. The void portion 4 forms in a straw-like shape, if a semiconductor device for a memory includes the long metal wire 1.

As described above, such a void portion 4 occurs in a series of semiconductor device manufacturing processes, when the protective layer is formed after the formation of the metal wire 1. In the next padding, drilling, and mask matching processes, enclosed gas will thermally expand in a straw-like void portion 4 due to heating, such as photoresist baking and annealing.

As a result, the gas in the void portion 4 will burst out at both ends of the straw-like shape or the openings, so that photoresist foaming and so on can occur, which causes damage to the protective layers. If an escape hole is drilled in order to prevent such trouble, a special process therefor must be provided, which will reversibly affect efficiency.

SUMMARY OF THE INVENTION

It is an object of the present invention to provide a semiconductor device, where a metal wiring pattern is improved in order to prevent photoresist foaming from occurring without employing a special process, even if a protective layer void should occur in a wire to wire space near the metal wire, and provides an arrangement method for a semiconductor device pattern.

More particularly, the present invention provides a semiconductor device, where a straw-like void is cut and a gas escape path is formed within the void portion by increasing the wire to wire spacing for the metal wire at every constant pitch, in order to prevent photoresist foaming from occurring, and provides an arrangement method for a semiconductor device pattern.

To achieve the above object, the present invention provides a semiconductor device comprising a first wiring layer and a second wiring layer arranged in a row on a semiconductor substrate, and a insulating layer on the first wiring layer and the second wiring layer so that a first portion of the insulating layer on the first wiring layer is prevented from touching a second portion of the insulating layer on the second wiring layer.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

A more complete appreciation of the present invention and many of its attendant advantages will be readily obtained by reference to the following detailed description considered in connection with the accompanying drawings, in which.

DETAILED DESCRIPTION OF PREFERRED EMBODIMENTS

Embodiments of the present invention will be described in detail with reference to the drawings.

Figure 4:
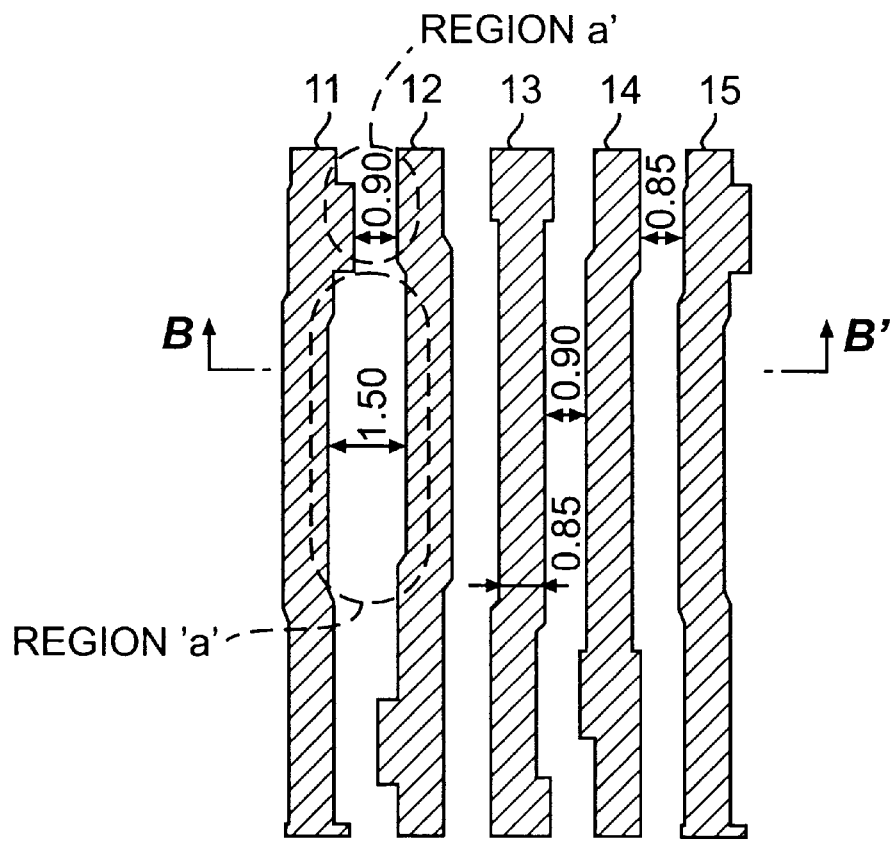
FIG. 4 shows a pattern of the metal wiring layer in the embodiment.

FIG. 4 shows a metal wiring pattern for the semiconductor device according to the present invention.

Figure 5:
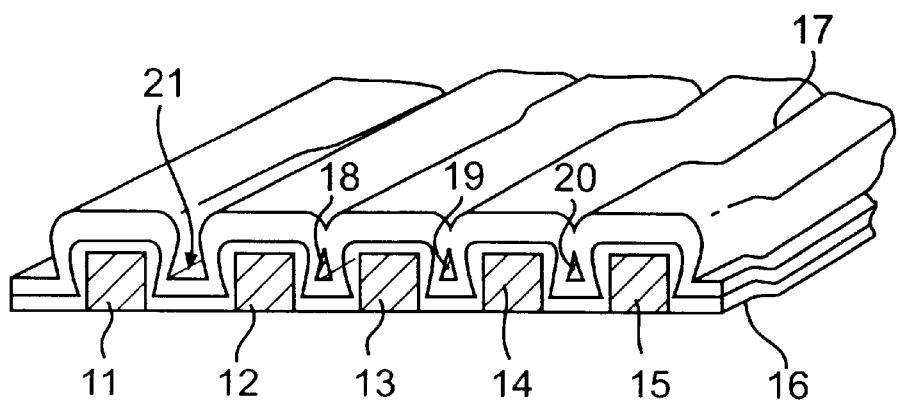
FIG. 5 is a sectional view of FIG. 4.

As shown in FIG. 4, similarly to the conventional wiring pattern shown in FIG. 5, two or more metal wires 11 to 15 are arranged in a row on the interlayer insulating layer in the memory cell region on a semiconductor chip. As materials for metal wires 11 to 15, Al, Si, Cu or alloys thereof can be appropriately selected. Metal wires 11 to 15 are about 0.9±0.1 µm each in width. Each space for metal wires 11 to 15 becomes narrower in a portion a' where contact holes are made to connect with the upper wiring layer or the lower diffusion layer and so on. However, the wire to wire spaces in the other portions are about 0.9±0.1 µm.

Figure 1:
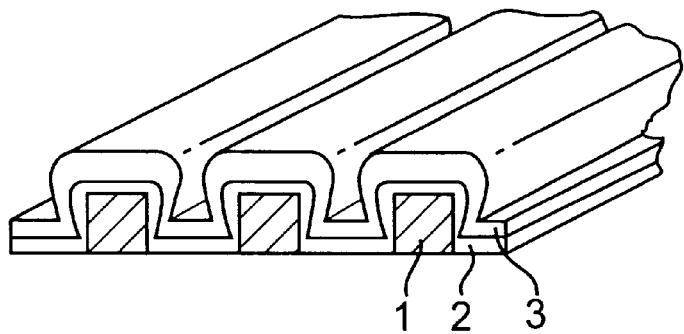
FIG. 1 is a sectional view of the conventional semiconductor device in this invention.
Figure 2:
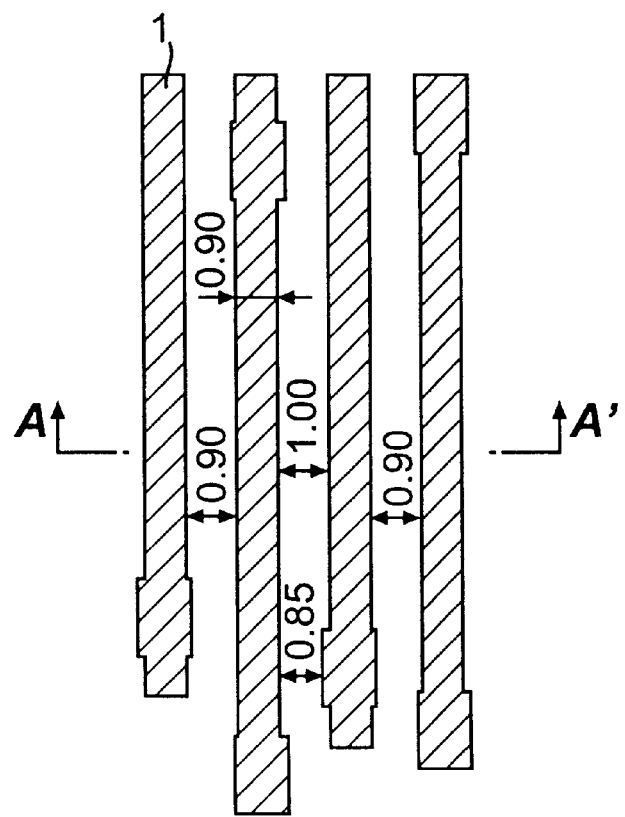
FIG. 2 shows a pattern of the conventional metal wiring layer in this invention.

Particularly, a different point from that in the conventional wiring pattern shown in FIG. 2 is where a metal wiring space is more widely secured in a given region than the normal space. As shown in FIG. 4, for example, a space between metal wires 11 and 12 shall be fixed in the region 'a' at about 1.50 µm. This space can be properly selected according to conditions for semiconductor substrate manufacturing processes and manufacturing equipment. As shown in FIG. 4, the numeric value is an example for width of metal wiring and wire to wire space (µm in unit).

Figure 3:
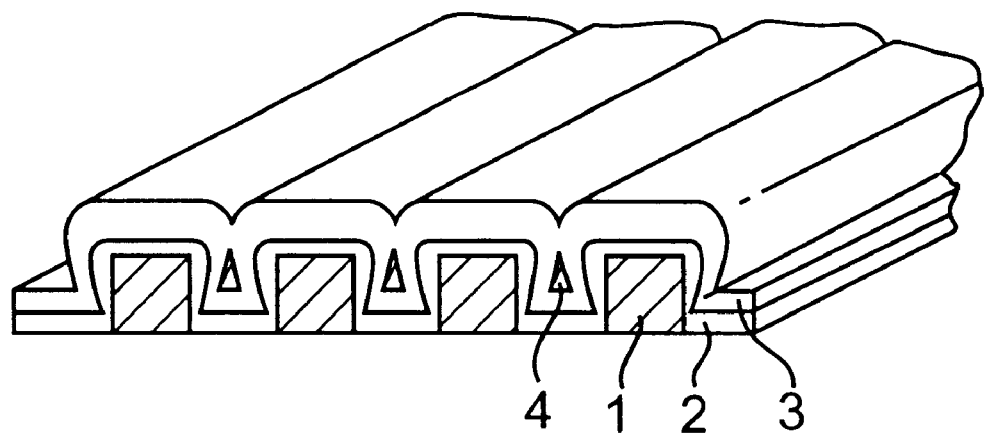
FIG. 3 is a sectional view of FIG. 2.

FIG. 5 shows a sectional view of the semiconductor device at the wiring pattern B–B' shown in FIG. 4. Similarly to FIG. 3, the semiconductor device is highly refined to design the narrower a space for metal wiring.

In order to prevent deterioration due to humidity in the open air, the first passivation layer 16, a surface protective layer, is formed on metal wires 11 to 15. This layer is formed at about 0.3 to 0.4 µm thickness above the first layer, made from, for example, PSG (Phospho Silicate Glass) or TEOS (Tetraethoxysilane) in the same manner as in the prior art.

Further, the second passivation layer 17, made from P (plasma)-SiN, is formed on the first passivation layer 16 to about 0.55 µm thickness above the first layer. Furthermore, a protective layer, made from polyimide, is formed on the second passivation layer 17 in a thickness about 5 µm.

Accordingly, the passivation layer covering each metal wire is about 0.6 µm in thickness in the lateral direction, while the wire to wire space to each adjacent metal wire is about 0.9±0.1 µm, in the same manner as in the conventional art regarding metal wires 12 to 15. Thus, the adjacent portions of the passivation layer overlap each other. As a result, voids 18 to 20 are formed in a straw-like shape in the space for metal wires 12 to 15.

On the other hand, since the wire to wire space between metal wires 11 and 12 is 1.5 µm in the region 'a' shown in FIG. 4, for example, even if the passivation layer was 0.6 µm in thickness in the lateral direction, a portion of the passivation layer 17 on the metal wire 11 never touches that on the metal wire 12. Accordingly, the escape hole 21 is formed, as shown in FIG. 5. That is, the passivation layers 16 and 17 covering each metal wire are 0.6 µm in width in the lateral direction, while the wire to wire space is about 1.50 µm in the region 'a' in FIG. 4. Thus, the escape hole 21 is about 0.3 µm in its diameter. The gas, which is thermally expanded within the voids (not illustrated), is discharged from the escape hole 21.

Figure 6:
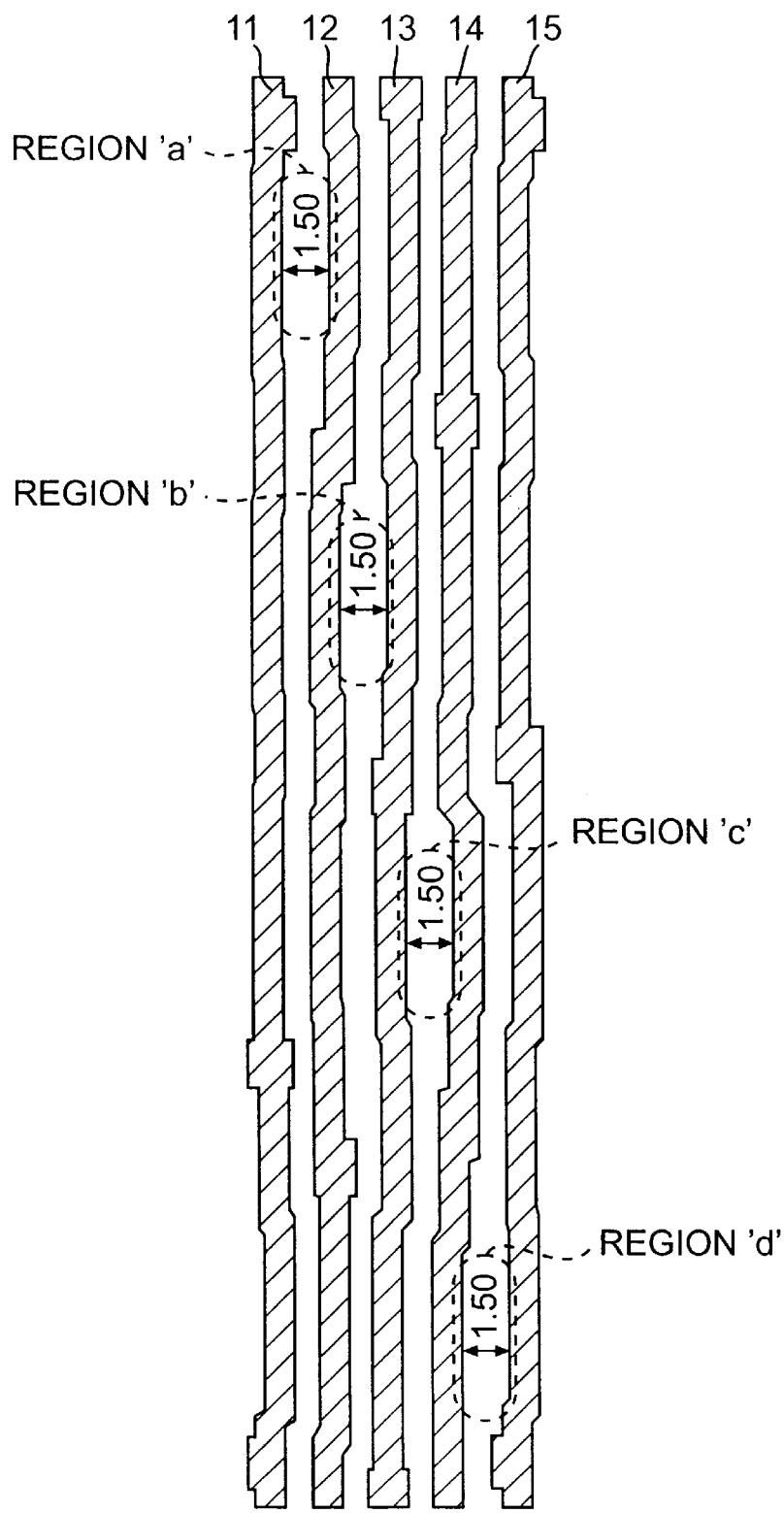
FIG. 6 shows a wider region of the pattern of the metal wiring layer than the region shown by FIG. 4 in the embodiment.

Next, individual positions at the escape hole in voids 18 to 20 will be explained. FIG. 6 shows the pattern diagram for the metal wiring layer in the wider region. The region 'a' shown in FIG. 4 is formed at the upper left position between metal wires 11 and 12 in FIG. 6. Voids 18 to 20 are formed in a straw-like shape between metal wires 12 and 13, 13 and 14, 14 and 15, respectively. Therefore, by providing a region to form an escape hole 21 at a given space with the two or more metal wires 11 to 15 arranged in a parallel row, the escape hole 21 can be formed a path for the gas to escape.

In other words, the first metal wire 11 or/and the second metal wire 12 should be shifted each other within the region 'a', so that the wire to wire space in region 'a' is wider than that in the other portion of the metal wire. Second, second metal wire 12 or/and the 3rd metal wire 13 are shifted each other within the region 'b' away from the region 'a'. Similarly, metal wires 13 and 14, and metal wires 14 and 15 are shifted each other appropriately within regions c and d, respectively. At this time, if each metal wire position is simply shifted, failures may occur, considering the connection with memory cells on the semiconductor chip surface. In order to prevent such failures, if the metal wire width becomes smaller by an increase at width of region 'a', 'b', 'c', or 'd' in order to prevent the metal wire positions from changing, a trouble such as elecromigration would occur.

As a result of considering these problems, the configuration for the metal wires 11 to 15 can be presented as shown in FIG. 6. The regions 'a' to 'd' positions can be located at regular intervals, while the metal wires can be appropriately arranged at random in a range without moving in the lateral direction, as shown in FIG. 6.

As described above, in regard to two or more metal wires, which are arranged in a row, a region is provided where space can be increased between individual metal wires. And the space shall be designed in an area to so that a portion of the protective layer covering one metal wire prevents from touching to a portion of the protective layer covering adjacent metal wire. Therefore, since an escape hole is produced for gas generated within a straw-like void formed between metal wires, the expansion of gas generated within the voids is reduced to prevent photoresist foaming from occurring.

In addition, the above embodiments for the present invention have established a passivation layer, which is comprised of a double-layer structure of the first and second passivation layers 16 and 17, but not limited to this particular format, and may be composed of other protective layers.

Furthermore, the above embodiments has described the wiring pattern, which are arranged in nearly parallel, but not limited to the particular. The present invention can also be appropriately applied to patterns, even in cases when at least two metal wires are depicted in a row, forming a linear pattern, a curve pattern, or a pattern with halfway bending position.

Moreover, even when two or more wires are depicted in a row in a part of the entire pattern, the present invention can be applied to such the part. In addition, materials for wires are not limited to metal. The present invention can be applied similarly to the case when appropriate layers, other than protective and passivation layers, cover the wires.

As described above, the present invention has improved wiring patterns, e.g. metal wiring, so as to prevent photoresist from foaming, even if voids occurred in protective layers on the wire to wire space in the wire pattern, such as for metal wires, without using a special process. More particularly, according to the present invention, it is capable of providing a semiconductor device, where a gas escape path is formed within a straw-like void portion by increasing the wire to wire spacing in the wire pattern.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A semiconductor device comprising:
    a semiconductor substrate;
    a first wiring layer and second wiring layer on the semiconductor substrate;
    a first portion between the first and the second wiring layers, having a first width between the first and the second wiring layers;
    a second portion between the first and the second wiring layers, having a second width between the first and the second wiring layers, which is wider than the first width;
    an insulating layer on the semiconductor substrate, the first wiring layer and the second wiring layer; and
    wherein the second portion has a depression deeper than the top of the first and the second wiring layer; and the first portion has a shallow depression, not deeper than the top of the first and the second wiring layers.

2. The semiconductor device according to claim 1, wherein a width between a first portion of the first wiring layer corresponds to the first portion of the insulating layer, and a second portion of the second wiring layer corresponds to the second portion of the insulating layer is larger than a width between any other portion of the first wiring layer, and the second wiring layer.

3. The semiconductor device according to claim 1, wherein the first wiring layer and the second wiring layer comprise a metal selected from the group consisting of Al, Si, Cu, and an alloy thereof.

4. The semiconductor device according to claim 1, wherein the insulating layer comprises plasma-SiN.

5. A semiconductor device comprising:
    a semiconductor substrate;
    a first wiring layer, a second wiring layer, a third wiring layer, a fourth wiring layer and a fifth wiring layer on the semiconductor substrate;
    a first portion and a second portion between the first and the second wiring layers, having a first width and a second width between the first and the second wiring layers, respectively, in which the first width is narrower than the second portion;
    a third portion and a fourth portion between the second and the third wiring layers, having a third width and a fourth width between the first and the second wiring layers, respectively, in which the third portion is narrower than the fourth width;
    a fifth portion and a sixth portion between the third and the fourth wiring layers, having a fifth width and a sixth width between the third and the fourth wiring layers, respectively, in which the fifth width is narrower than the sixth with;
    a seventh portion and a eighth portion between the fourth and the fifth wiring layers, having a seventh width and a eighth width between the fourth and the fifth wiring layers, respectively, in which the seventh width is narrower than the eighth width;
    an insulating layer on the semiconductor substrate, the first wiring layer, the second wiring layer, the third wiring layer, the fourth wiring layer and the fifth wiring layer; and
    wherein the second portion, the fourth portion, the sixth portion and the eighth portion have a depression deeper than the top of the first and the second wiring layers, the top of the second and the third wiring layers, the top of the third wiring layer and the fourth wiring layer and the top of the fourth wiring layer and the fifth wiring layer, respectively; and the first portion, the third portion, the fifth portion and the seventh portion have shallower depressions than the top of the first and the second wiring layers, the top of the second and the third wiring layers, the top of the third wiring layer and the fourth wiring layer and the top of the fourth wiring layer and the fifth wiring layer, respectively.

6. The semiconductor device according to claim 5, wherein a first region between the first portion of the insulating layer and the second portion of the insulating layer, a second region between the third portion of the insulating layer and the fourth portion of the insulating layer, a third region between the fifth portion of the insulating layer and the sixth portion of the insulating layer, and a fourth region between the seventh portion of the insulating layer and the eighth portion of the insulating layer are not adjacent each other.

7. The semiconductor device according to claim 5, wherein the first wiring layer and the second wiring layer comprise a metal selected from the group consisting of Al, Si, Cu, and an alloy thereof.

8. The semiconductor device according to claim 5, wherein the insulating layer comprises plasma-SiN.

9. The semiconductor device according to claim 6, wherein a first distance between the first region and the second region, a second distance between the second region and third region, and a third distance between the third region and the fourth region are nearly equal each other.

* * * * *

UNITED STATES PATENT AND TRADEMARK OFFICE
CERTIFICATE OF CORRECTION

PATENT NO. : 6,153,937
DATED : November 28, 2000
INVENTORS : Seishi IRIE et al.

It is certified that error appears in the above-identified patent and that said Letters Patent is hereby corrected as shown below:

Title Page, Item [57], in the Abstract, line 5, "occur" should read --occurs--.

Title Page, Item [57], in the Abstract, line 10, "a insulating" should read --an insulating--.

Claim 5, col. 6, line 14, "sixth with" should read --sixth width--.

Claim 5, col. 6, line 15, "a eighth" should read --an eighth--.

Claim 5, col. 6, line 17, "a eighth" should read --an eighth--.

Signed and Sealed this

Fifteenth Day of May, 2001

*Attest:*

NICHOLAS P. GODICI

*Attesting Officer*  *Acting Director of the United States Patent and Trademark Office*